United States Patent
Basting et al.

(10) Patent No.: US 6,393,037 B1
(45) Date of Patent: May 21, 2002

(54) WAVELENGTH SELECTOR FOR LASER WITH ADJUSTABLE ANGULAR DISPERSION

(75) Inventors: Dirk Basting, Göttingen (DE); Sergei V. Govorkov, Boca Raton, FL (US)

(73) Assignee: Lambda Physik AG, Goettingen (DE)

( * ) Notice: Subject to any disclaimer, the term of this patent is extended or adjusted under 35 U.S.C. 154(b) by 0 days.

(21) Appl. No.: 09/244,554

(22) Filed: Feb. 3, 1999

(51) Int. Cl.$^7$ .............................. H01S 3/10; H01S 3/22; H01S 3/08

(52) U.S. Cl. .............................. 372/20; 372/57; 372/98; 372/99; 372/100; 372/107

(58) Field of Search .............................. 372/20, 24, 32, 372/57, 9, 16, 29.01, 98, 99, 100, 102, 107

(56) References Cited

U.S. PATENT DOCUMENTS

| | | | |
|---|---|---|---|
| 3,868,592 A | | 2/1975 | Yarborough et al. ....... 331/94.5 |
| 4,016,504 A | * | 4/1977 | Klauminzer ........... 331/94.5 C |
| 4,696,012 A | | 9/1987 | Harshaw ...................... 372/99 |
| 4,873,692 A | | 10/1989 | Johnson et al. ............... 372/20 |
| 4,972,429 A | | 11/1990 | Herbst ........................ 372/100 |
| 5,095,492 A | | 3/1992 | Sandstrom ................. 372/102 |
| 5,226,050 A | * | 7/1993 | Burghardt .................... 372/20 |
| 5,373,515 A | * | 12/1994 | Wakabayashi et al. ........ 372/20 |
| 5,596,456 A | | 1/1997 | Luecke ....................... 359/831 |
| 5,646,954 A | | 7/1997 | Das et al. ..................... 372/55 |
| 5,684,822 A | | 11/1997 | Partlo .......................... 372/95 |
| 6,192,064 B1 | * | 2/2001 | Algots et al. ............... 372/100 |

FOREIGN PATENT DOCUMENTS

| | | | |
|---|---|---|---|
| JP | 2631554 | * | 7/1997 |

OTHER PUBLICATIONS

"Electronic Tuning of Dye Lasers by an Electrooptic Birefringent Fabry–Perot Etalon", M. Okada and S. Ieiri, Optics Communications, vol. 14, No. 1, North–Holland Publishing Company– Amsterdam, May 1975.

"Modes of a Laser Resonator Containing Tilted Birefringent Plates", A. Bloom, Journal of The Optical Society of America, vol. 64, No. 4, Lancaster Press, Inc., Lancaster PA, Apr. 1974.

"An Efficient, High–Power $F_2$ Laser Near 157nm$^{a)}$", J.R. Woodworth and J. K. Rice, Journal of Chem. Physics, vol. 69, No. 6, American Institute of Physics, Sep. 15, 1978.

"High–Power Efficient Vacuum Ultraviolet $F_2$ Laser Excited by an Electric Discharge", V.N. Ischenko, S.A. Kochubel, and A.M. Razhev, Soviet Journal of Quantum Electronics, vol. 16, No. 5, American Institute of Physics, May 1986.

"Experimental Study of Tunability of a Discharge Pumped Molecular Fluorine Laser", M. Kakehata, E. Hashimoto, F. Kannari, and M. Obara, Conference on Lasers and Electro–optics, vol. 7, Optical Society of America, May 1990.

* cited by examiner

Primary Examiner—Frank G. Font
Assistant Examiner—Armando Rodriguez
(74) Attorney, Agent, or Firm—Sierra Patent Group, Ltd.; Andrew V. Smith

(57) ABSTRACT

A tunable laser is provided having a gain medium and a resonator for generating a laser beam, and an angular dispersion element. The laser further includes a beam expander with adjustable magnification for adjusting an angular dispersion provided by the dispersion element. The adjustable beam expander preferably includes one or two rotatable prisms. When two prisms are used, the prisms are preferably synchronously rotatable according to a preset ratio such that any changes in refraction angle due to the rotation of the first prism are automatically compensated by the rotation of the second prism. A single prism may serve both as a dispersion element and as a beam expansion element. A processor preferably monitors the linewidth and wavelength of the output beam and adjusts an orientation of the prism or prisms of the expansion unit, and the tilt of either a reflection grating or a highly reflective mirror of the resonator in a feedback loop.

66 Claims, 5 Drawing Sheets

WAVELENGTH SELECTOR FOR LASER WITH ADJUSTABLE ANGULAR DISPERSION

BACKGROUND OF THE INVENTION

1. Field of the Invention

The present invention relates to a laser including an angular dispersion element, and particularly to a laser including a beam expander for varying the magnitude of the angular dispersion provided by the dispersion element.

2. Discussion of the Related Art

Lasers emitting spectrally narrowed output beams are useful in a broad range of applications. Among these lasers, excimer lasers including KrF-, ArF-, XeCl-, XeF- and $F_2$-lasers, exhibit output emission wavelengths in the deep ultraviolet (DUV) and the vacuum ultraviolet (VUV) regions of the electromagnetic spectrum. A typical setup of an excimer laser system includes a resonator and a discharge chamber filled with a gas mixture and connected to a power supply for generating an output beam, and a wavelength selection unit.

Without a wavelength selection unit, the natural output beam of an excimer laser is spectrally very broad (e.g., having a linewidth around 500 pm) compared with a linewidth desired for applications in microlithography (around one picometer or less). The linewidth is thus narrowed by the wavelength selection unit which also allows a particular narrow band of wavelengths within the broadband spectrum of the excimer laser to be selected as the output.

The wavelength selection unit typically includes one or more prisms and/or a grating or a highly reflective mirror producing angular wavelength dispersion. The dispersive nature of the prism and/or grating causes the linewidth of the output beam to be narrowed because only the rays within the acceptance angle of the resonator are selected as laser radiation evolves. Conventional wavelength selection units exhibit a fixed dispersion or beam expansion meaning that the dispersion or expansion ratio cannot be adjusted during laser operation. Consequently, to adjust the linewidth of a conventional laser, the system must be taken off-line and the wavelength selection unit adjusted or replaced by one that produces the now desired linewidth.

One prominent application of excimer lasers having narrowed spectral emission bands is microlithographic processing for creating various structures in microelectronics. Narrowed spectral linewidths are desired because minimum feature size and depth of focus are limited by chromatic aberrations of projection optics.

Dispersive gratings have been employed for spectral narrowing. See, e.g., U.S. Pat. No. 5,095,492 to Sandstrom; U.S. Pat. No. 4,696,012 to Harshaw. Prisms have been used as wavelength selection devices. See, e.g., M. Kakehata, et al., *Experimental Study of Tunability of Discharge Pumped Molecular Fluorine Laser*, Optical Society of America, Conference on Lasers and Electro-Optics (CLEO), Vol. 7 (May 1990). Fabry-Perot etalons have also been employed as wavelength selection devices. See M. Okada and S. Ieiri, *Electronic Tuning of Dye Lasers by an Electro-Optic Birefringent Fabry-Perot Etalon*, Optics Communications, vol. 14, No. 1 (May 1975). Birefringent plates have also been used for wavelength selection. See A. Bloom, *Modes of a Laser Resonator Containing Tilted Birefringent Plates*, Journal of the Optical Society of America, Vol. 64, No. 4 (April 1974); See also U.S. Pat. No. 3,868,592 to Yarborough et al. Unstable resonator configurations have been employed within pulsed excimer lasers. See, e.g., U.S. Pat. No. 5,684,822 to Partlo. U.S. Pat. No. 4,873,692 to Johnson et al. discloses a solid state laser including a rotatable grating and a fixed beam expander for narrowing the linewidth and tuning the wavelength of the laser. Further background information on methods of spectral linewidth narrowing of lasers can be found in textbooks on the tunable lasers. See, e.g., A. E. Siegman, Lasers (1986).

In addition, U.S. Pat. No. 4,972,429 to Herbst describes an achromatic beam expander for a high magnification and tunable laser. U.S. Pat. No. 5,596,456 to Luecke describes an achromatic anamorphic prism pair. These achromatic setups are designed to produce an output beam of a laser whose beam direction is independent of wavelength, and each includes an arrangement of prisms that are fixed in their orientations. Neither arrangement produces a beam wherein the linewidth and wavelength are adjustable.

The spectral linewidth of a laser output depends on several factors, including the angular dispersion of the wavelength selection unit, the angular acceptance of the resonator, and pulse duration and shape. In an excimer laser, since relatively few roundtrips occur per pulse, even small changes in pulse duration and/or shape can cause noticeable changes in the output emission linewidth. Any change in the angular acceptance of the resonator, which depends on such factors as the electrical discharge intensity distribution and the geometrical shape of the electrodes, may also cause the linewidth to vary. These factors are difficult to control. Moreover, minimal downtime for higher throughput is important in today's industrial environment. Therefore, there is a need for a reliable way of automatically adjusting laser output emission linewidths "on-line", i.e., during operation of the laser. At the same time, it is also desired to have a laser system whose output emission wavelength and linewidth may be separately controlled.

SUMMARY OF THE INVENTION

It is an object of the invention to provide a laser system having a wavelength selection unit with variable dispersion such that the linewidth of the output laser beam is adjustable to a selected value.

It is a further object to provide the above laser system such that the wavelength of the output laser beam may be held to selected values when the dispersion is varied.

It is a further object to provide the above laser system such that each of the linewidth, wavelength are monitored and adjusted while the system is on-line using a feedback loop.

To meet these objects, a tunable laser system is provided including a resonator and a gain medium excited by a power supply for generating a spectral output emission, and a wavelength selection unit including an angular dispersion element. The wavelength selection unit also includes an adjustable beam expander for adjustably magnifying the angular dispersion. Separate optical elements, such as a grating and one or more prisms, or a single element, such as a prism, may provide the dispersion and the adjustable beam expansion. The adjustable beam expander preferably includes two synchronously rotatable prisms wherein a refraction angle change caused by rotation of one of the prisms is compensated by rotation of the other prism.

A processor preferably adjusts the orientation of the rotatable prisms and the tilt angle of a grating or highly reflective mirror of the resonator to control the linewidth and wavelength of the output laser beam. The linewidth may be controlled and/or adjusted to a certain linewidth on-line and automatically while the wavelength is maintained as desired by the processor in a feedback loop.

DETAILED DESCRIPTION OF THE PREFERRED EMBODIMENTS

Wavelength selection units commonly used in lasers for spectral linewidth narrowing can be divided into two groups. The first group utilizes a dependence of the angle at which the selection unit reflects light on the wavelength of the light (angular wavelength dispersion). The second group utilizes other effects such as wavelength dependent birefringence in birefringent filters, or multiwave interference in interference filters.

Figure 1A:
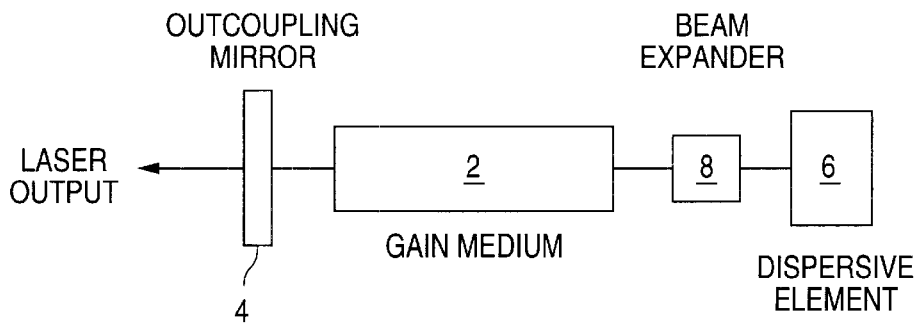
FIG. 1a shows a first embodiment of a laser resonator according to the present invention having a wavelength selection unit employing an angular wavelength dispersion element and a beam expander for controlling and adjusting emission wavelength and linewidth.
Figure 1B:
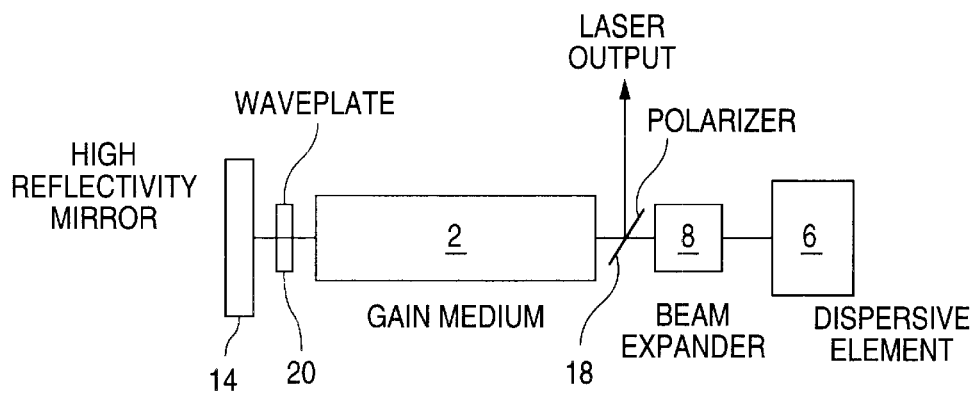
FIG. 1b shows a second embodiment of a laser resonator according to the present invention having a wavelength selection unit employing an angular wavelength dispersion element and a beam expander for controlling and adjusting emission wavelength and linewidth.

The first group of selection units is widely used in high power lasers due to their high reliability and wavelength resolving power. FIGS. 1a & 1b show two embodiments of a laser system having a wavelength selection unit employing an angular wavelength dispersion element and a beam expander according to the present invention. Many other resonator arrangements within the scope of the present invention including, e.g., alternative output coupling means may be substituted for those shown.

FIG. 1a illustrates an arrangement wherein a linear resonator is used. The arrangement of FIG. 1a includes a gain medium 2, an outcoupling mirror 4, an angular dispersive element 6 and a beam expander 8. As described below, the angular dispersive element 6 and the beam expander 8 may be separate optical elements. Alternatively, a single optical component may function to facilitate both angular dispersion and beam expansion.

FIG. 1b illustrates an arrangement wherein a polarization-outcoupled resonator is used. The arrangement of FIG. 1b includes the gain medium 2, a highly reflective mirror 14, the angular dispersive element 6, the beam expander 8 and a polarization output coupler 18. A waveplate 20 is also shown.

The angular dispersive element 6 of each of the embodiments of FIGS. 1a & 1b reflects different spectral components within the emission band of the laser gain medium at different angles. Those wavelength components that are reflected at larger angles to the optical axis of the resonator suffer greater losses on subsequent roundtrips, and linewidth narrowing is thus provided.

Linewidth narrowing occurs because those wavelength components of the beam emerging from the beam expander at angles larger than the fixed acceptance angle of the resonator of the laser are eliminated from the beam as it resonates. Thus, the linewidth of the output beam is inversely proportional to the dispersion, $(\delta\alpha/\delta\lambda)_{(dispersive\ element)}$, of the dispersive element 6. The linewidth is narrowed further when the dispersion $(\delta\alpha/\delta\lambda)_{(dispersive\ element)}$ is magnified by the adjustable beam expander 8 of the present invention because a smaller range of wavelengths emanate from the beam expander 8 at angles within the acceptance angle of the resonator. Thus, the linewidth is understood to be inversely proportional to the product of the dispersion $(\delta\alpha/\delta\lambda)_{(dispersive\ element)}$ of the dispersive element 6 and the magnification M of the beam expander 8. This product is hereinafter referred to as the total dispersion $(\delta\alpha/\delta\lambda)_{(total)}$.

The beam expanders 8 of each of the embodiments of FIGS. 1a & 1b function to magnify the angular dispersion $(\delta\alpha/\delta\lambda)_{(dispersive\ element)}$ already produced by the dispersive element 6. Thus, since a total angular dispersion, $(d\alpha/d\lambda)_{(total)}$, of the combination of the dispersive element 6 and the beam expander 8 is the product of the angular dispersion, $(\delta\alpha/\delta\lambda)_{(dispersive\ element)}$, of the dispersive element 6 and the magnification M of the beam expander 8, we can write:

$$(d\alpha/d\lambda)_{(total)} = M \cdot (d\alpha/d\lambda)_{(dispersive\ element)} \quad (1)$$

The dispersive element 6 may comprise any of a wide variety of optical elements and combinations of optical components including, for example, a dispersive prism and a highly reflective mirror, a diffraction grating aligned for retroreflecting the incident beam (Littrow configuration), and a dispersive prism and a diffraction grating. The tilt of either the highly reflective mirror, which is coupled with the prism of the dispersion element, or the grating, if the Littrow configuration is used, may be adjusted by a processor to control or tune the output emission wavelength.

The beam expander 8 preferably comprises two prisms, and alternatively comprises a single prism, as described more particularly below. The magnification M of the beam expander 8 of the present invention may be adjusted by rotating the prisms. The angular dispersion $(d\alpha/d\lambda)_{(dispersive\ element)}$ of the angular dispersion element 6 may also be adjusted. By adjusting either the magnification M, the angular dispersion $(d\alpha/d\lambda)_{(dispersive\ element)}$ of the dispersive element 6, or both, the total angular dispersion $(d\alpha/d\lambda)_{(total)}$ is adjusted according to formula (1), and as discussed, the linewidth of the output beam is inversely proportional to the total dispersion $(d\alpha/d\lambda)_{(total)}$. Several preferred configurations of angular dispersion elements 6 and beam expanders 8 will be described below, as well as preferred techniques for adjusting the total angular dispersion $(d\alpha/d\lambda)_{(total)}$ as described generally above.

Preferably, the total angular dispersion $(d\alpha/d\lambda)_{(total)}$ is adjusted by adjusting the magnification M of the beam expander 8. As discussed more particularly below, in a preferred embodiment, the adjustment of the magnification M is achieved by changing the incidence angle of the beam onto the surface of the first of two prisms of the beam expander 8. This incidence angle is changed by rotating this prism. The second prism is also rotated to compensate the change in refraction angle caused by the rotation of the first prism for maintaining the selected output emission wavelength.

Figure 6:
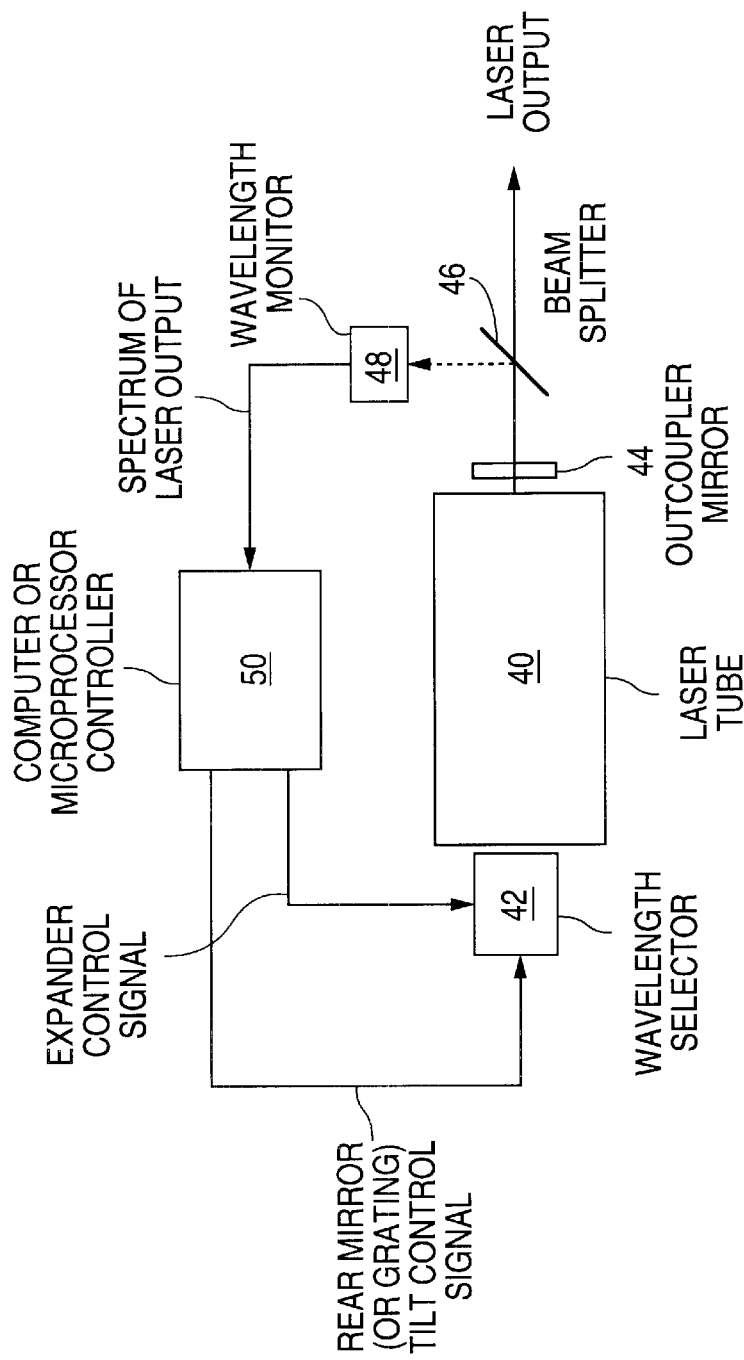
FIG. 6 shows a complete laser system according to a preferred embodiment of the present invention.

As also described more fully below with reference to FIG. 6, the present invention advantageously provides the adjustability in magnification (or beam expansion or dispersivity) by preferably employing a feedback loop using a processor which controls the rotation of the prisms as well as the tilt of the highly reflective mirror or grating. In this way, the wavelength may be maintained as the linewidth is adjusted on-line.

Figure 2A:
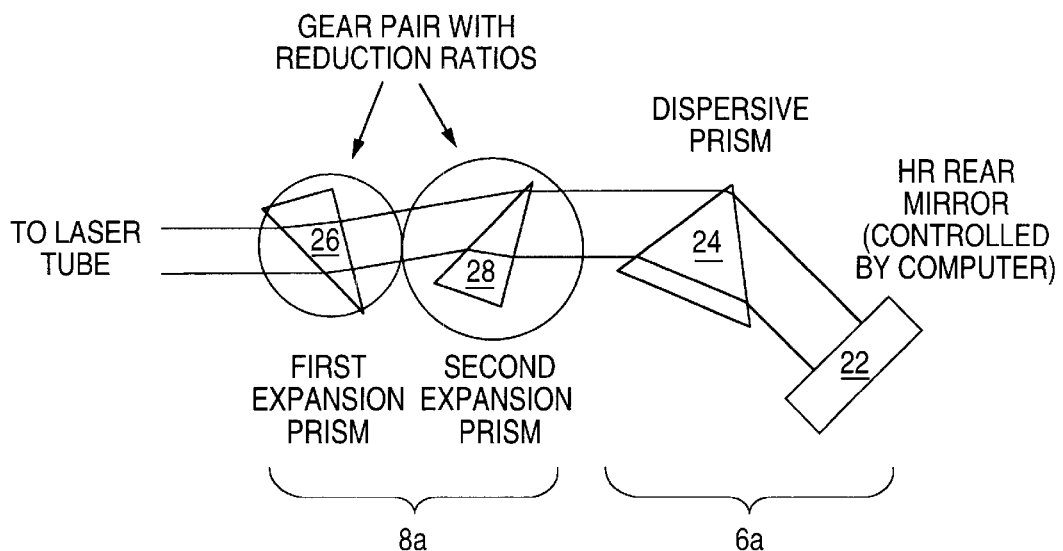
FIG. 2a shows a first embodiment of a wavelength selection unit according to the present invention.

FIGS. 2a–2e show several alternative combinative configurations of angular dispersive elements 6a–6b & 6d–6e and beam expanders 8a & 8c–8e. The preferred embodiment is shown in FIG. 2a. The angular dispersive element 6a used in the arrangement of FIG. 2a includes a highly reflective mirror 22 and a dispersive prism 24. The tilt of the highly reflective mirror 22 is computer controlled for adjusting and tuning the output wavelength of the laser system. The dispersive prism 24 is responsible for angularly dispersing light reflecting from the mirror 22.

The beam expander 8a of the arrangement of FIG. 2a includes a first expansion prism 26 and a second expansion prism 28. Each of the first and second expansion prisms 26,28 is rotatable. Rotation of the expansion prisms 26 and 28 adjusts the magnification M of the beam expander 8a.

Conventional lasers emit output beams with fixed linewidths and are not easily modified to have a wavelength selection unit with adjustable dispersion or expansion ratio for varying the linewidth. One solution would be to modify a conventional wavelength selection unit to include a prism that is rotatable. Then, the expansion ratio or dispersion of the prism expander would be adjustable by rotating the prism. However, the refraction angle from the first expansion prism 26 would change when the prism is rotated. If not compensated for, this refraction angle change will result in a change in the output emission wavelength generated by the laser system because a different range of wavelengths emanating from the beam expander 8 would now lie within the acceptance angle of the resonator.

The highly reflective mirror 22 of FIG. 2a (or the grating 30 of FIG. 2b discussed below), may be itself tilted or rotated to compensate for the refractive angle change caused by rotating the first prism 26. However, when it is desired to change the expansion ratio appreciably, the first prism 26 would be rotated a significant amount leading to a significant change in refraction angle. To compensate for this significant change in refraction angle, the mirror 22 or grating 30 would then have to be tilted or rotated through a large angle. Unfortunately, a system wherein the mirror 22 or grating 30 must be tilted or rotated through a large angle is at odds with the desire to be able to increment the rotation of the mirror 22 or grating 30 to achieve the smallest possible wavelength resolution. Also, large refraction angle changes may cause beam displacements that in turn will require additional degrees of freedom in making further mechanical adjustments.

For this reason, in the preferred embodiment, the beam expander includes a second expansion prism 28 which can be used to compensate the change in the refraction angle of the beam which occurs when the first expansion prism 26 is rotated. Preferably, the first and second prisms 26,28 are rotatable in synchronous fashion in a manner to substantially compensate for the change in refraction angle. Once the prism pair is rotated, the highly reflective mirror 22 or grating 30 may be tilted or rotated slightly to more precisely compensate the refraction angle change. Advantageously, all of the elements in this optical system may be adjusted automatically using a processor and a feedback loop as shown in FIG. 6 employed for on-line monitoring and adjusting of the linewidth and wavelength of the output emission beam of the complete laser system.

The first and second expansion prisms 26,28 are preferably rotated "synchronously". The synchronization of the rotation of the expansion prisms 26 and 28 is provided either by computer controlled rotation, and/or by mounting the prisms 26,28 onto rotational stages linked through a gear pair or belt drive with reduction ratio S. That is, the ratio of the angular velocity $\omega_1$ of the first expansion prism 26 to the angular velocity $\omega_2$ of the second expansion prism 28 is equal to the gear ratio S, which is preferably more than one (i.e., the second expansion prism 28 is preferably rotated slower than the first expansion prism 26). The preferred precise value of S is a function of the apex angle $\theta_1$ of the first expansion prism 26, the apex angle $\theta_2$ of the second expansion prism 28, the range of incidence angles and the refractive indices of the prisms, $n_1$ and $n_2$.

Preferably $n_1=n_2$, but the indices of refraction $n_1$ and $n_2$ of the first and second prisms 26 and 28, respectively, may be different. When employed in an excimer laser system, the prisms 26 and 28 each comprise a material having a substantial transmissivity in the deep ultraviolet (DUV) and/or vacuum ultraviolet range (VUV). Such materials as $CaF_2$ and $MgF_2$ are preferred.

Figure 3:
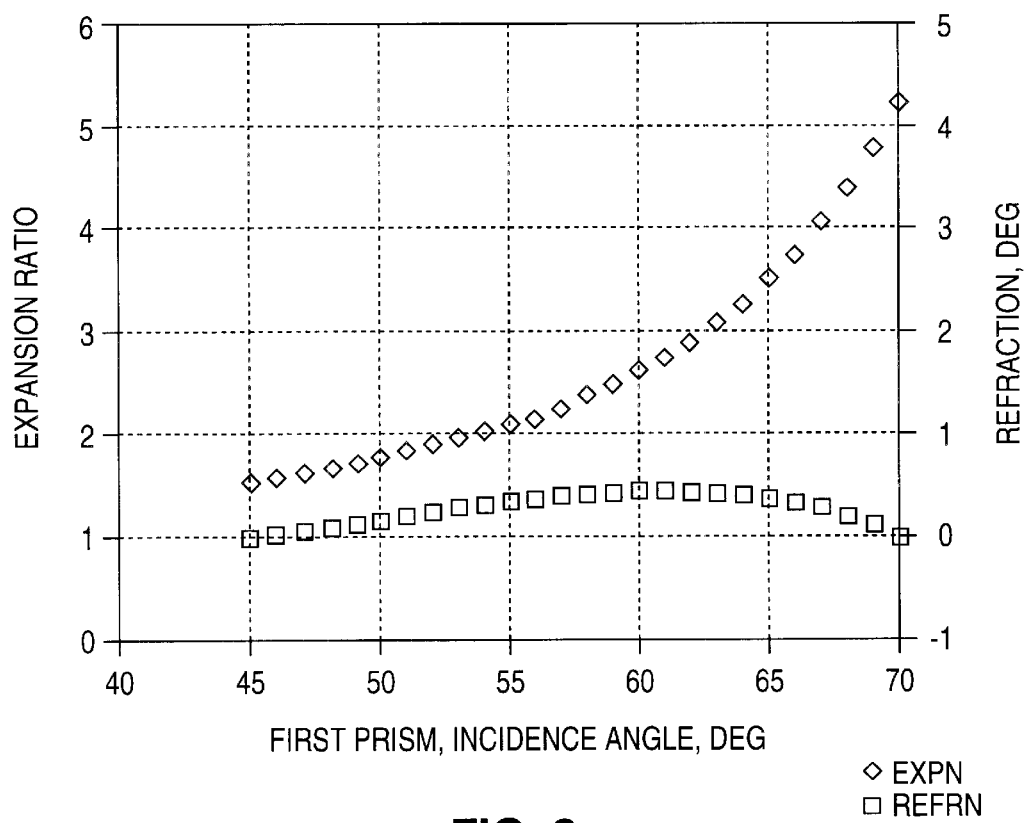
FIG. 3 illustrates the incidence angle dependence of the beam expansion ratio and refraction angle of the beam expander of the first and second embodiments of FIGS. 2a and 2b.

The plot of FIG. 3 shows an exemplary dependence of the magnification M, or the "expansion ratio", on the incidence angle of the beam at the entrance surface of the first expansion prism 26. The plot of FIG. 3 was generated using a theoretical model based on the arrangement of FIG. 2a wherein the expansion prisms 26,28 were taken to be similar prisms. The beam expands as it traverses the first prism 26 and the second prism 28. Thereafter, the beam passes through the dispersive prism before reflecting from the highly reflective mirror 22. The apex angle $\theta_1$ of the first expansion prism 26 and the apex angle $\theta_2$ of the second expansion prism 28 are preferably each equal to approximately 34°, the refractive indices $n_1,n_2$ of each prism 26,28, respectively, is approximately equal to 1.508 and the gear reduction ratio, or the ratio of the angular velocities of the prisms 26,28, is $S=\omega_1/\omega_2$ and is preferably approximately equal to 1.56. The apex angles of the two prisms 26 and 28 may however slightly or greatly differ, as desired.

An inspection of FIG. 3 reveals that the magnification M, or expansion ratio, of the system of FIG. 2a may be varied from approximately 1.5 to 4.5 when the incidence angle is changed by rotation of the first expansion prism 26 from approximately 45° to 70°. FIG. 3 also shows that the refraction angle of the beam only varies by at most 0.5° over the same interval.

This residual refraction of the beam may be compared to a typical resolution using computer controlled tilt of the highly reflective mirror 22 of the arrangement of FIG. 2a. For example, a dispersion of a typical dispersive prism of the preferred embodiment is approximately 1.8 mrad/nm at an incident wavelength of 248 nm. A wavelength controller having a typical resolution of 1 pm then has an angular resolution of approximately $1.8 \times 10^{-3}$ mrad. Therefore, a residual refraction of 0.5° corresponds to an angular adjustment range within 5,000 times the typical minimum increment of the controller, which is readily achievable.

The residual refraction of the beam may be modified by adjusting the gear reduction ratio S. Synchronization of the rotations of the two expansion prisms 26 and 28 is preferably realized using computer controlled synchronous rotation of the prisms 26,28. The synchronization of the prisms 26,28 may be realized with or without using a computer by mounting the prisms onto rotational stages preferably linked through a gear pair (or belt drive) with reduction ratio S.

Another way of providing synchronization of the prisms 26,28 is to mount each of the prisms 26,28 onto separate computer-controlled stages, wherein the computer calculates and controls the position of each prism 26,28 for a given expansion. In this alternative case, the ratio of angular velocities of the prisms may vary with refraction angle since it is the separate computer calculations and not the synchronous rotations of the prisms 26,28 that leads to the cancellation of the residual refraction for a given expansion ratio.

The exemplary numerical values of the prism apex angles $\theta_1$ and $\theta_2$ and the ratio S given above demonstrate some of the features of the present invention. These values are not asserted as being optimal values, and one skilled in the art could vary these values within the scope of and while still realizing the advantages and benefits of the present invention. It is also noted that lenses may generally be used as beam expansion devices, although it is not contemplated to use lenses as beam expanders in any of the embodiments of the present invention described here.

Figure 2B:
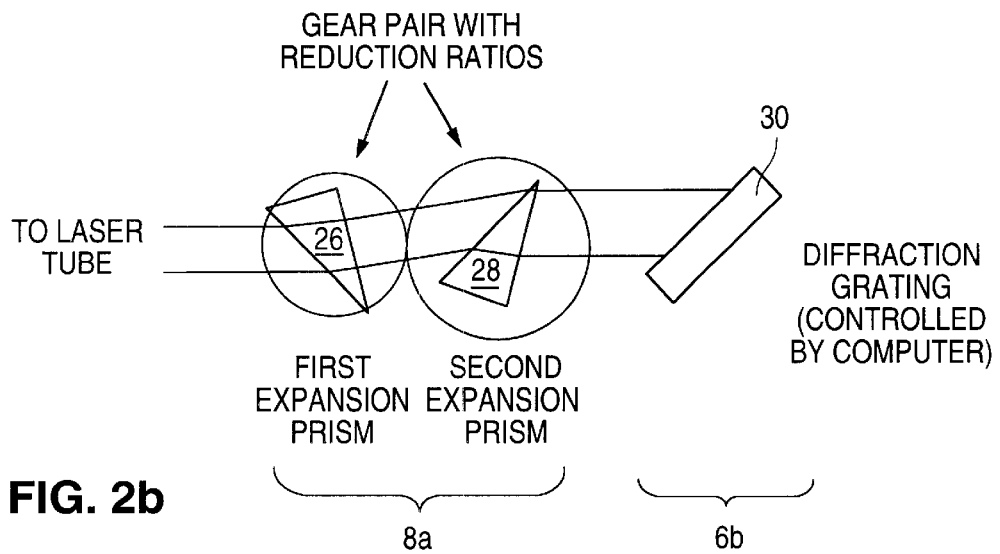
FIG. 2b shows a second embodiment of a wavelength selection unit according to the present invention.

The arrangement shown in FIG. 2b includes the same beam expansion unit 8a as the arrangement of FIG. 2a. The dispersive element 8b used in the arrangement of FIG. 2b, however, differs from that of FIG. 2a. A grating 30 is used as the dispersive element 8b in the arrangement of FIG. 2b instead of the prism 24 of FIG. 2a. The grating 30 also serves to reflect the beam, and thus the function of the highly reflective mirror 22 of FIG. 2a is also performed by the grating 30 and the highly reflective mirror 22 is thus not included in the arrangement of FIG. 2b.

Figure 2C:
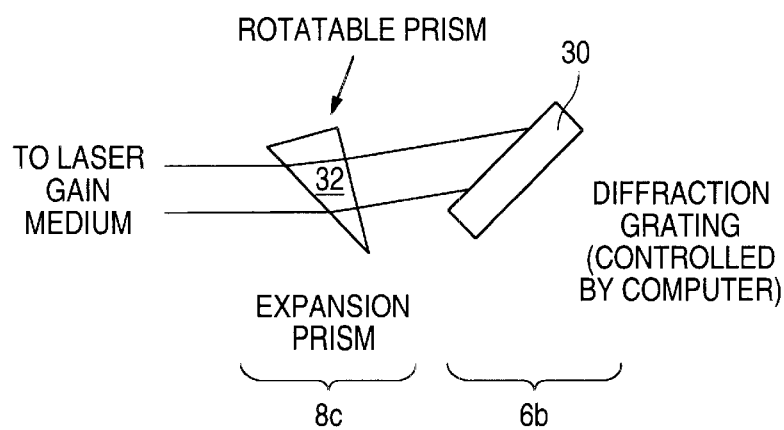
FIG. 2c shows a third embodiment of a wavelength selection unit according to the present invention.

The arrangement of FIG. 2c includes only a single rotatable prism as the variable beam expander 8c. The dispersive element 6b shown is a grating 30, as it is in the arrangement of FIG. 2b. The dispersive element 6b may alternatively include the prism 24 and the highly reflective mirror 22 of the arrangement of FIG. 2a. An advantage of using the beam expansion prism 8c shown in the arrangement of FIG. 2c over that shown in FIG. 2a is that the thickness of the optical material that the beam passes through is reduced. This total thickness reduction helps to reduce such effects as material degradation which may occur when materials are exposed to high intensity laser light, since dependence of laser performance on such material degradation effects is diminished as material thicknesses are reduced. Additionally, the laser beam encounters fewer total prism surfaces per round trip and thus suffers fewer reflective losses at prism surfaces. It is advantageous to minimize reflective losses where possible to minimize overall beam energy losses. Thus, the embodiment of FIG. 2c might be selected as a desirable alternative to that of FIG. 2a when it is desired to minimize optical losses and only small linewidth adjustments are required.

The refraction angle will change as a result of having only one prism 32 included in the beam expansion unit 8c, as contrasted with the two prisms 26 and 28 of the beam expansion units 8a of FIGS. 2a and 2b. The absence of the second prism 28 means that the grating 30 will be tilted to compensate for the entire refraction angle change caused by the expansion prism 32. For this reason, the arrangement of FIG. 2c also provides a smaller adjustable range of magnifications M and a lower total angular dispersion $(d\alpha/d\lambda)_{(total)}$ than is realized with the arrangements of FIGS. 2a and 2b. A lower angular dispersion ability is also normally accompanied by a lower wavelength resolution. An exemplary apex angle for the prism 32 is approximately 34°.

Figure 2D:
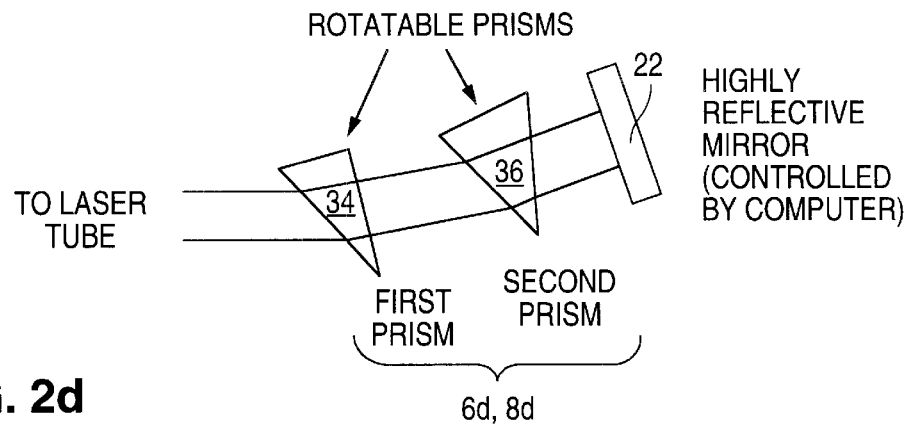
FIG. 2d shows a fourth embodiment of a wavelength selection unit according to the present invention.

Another exemplary arrangement in accordance with the present invention is shown in FIG. 2d. The arrangement of FIG. 2d includes a first prism 34, a second prism 36 and a highly reflective mirror 22. The first prism 34 may have a different, and if so preferably smaller, apex angle than the second prism 36. Each of the prisms 34 and 36 may be rotated either separately or, preferably, synchronously, just as the prisms 26 and 28 of the arrangements of FIGS. 2a and 2b are preferably rotated synchronously. As one or preferably both prisms 34 and 36 are rotated, the total dispersion $(d\alpha/d\lambda)_{(total)}$ is varied. The combination of the first and second prisms 34,36 functions as both a dispersive element 6d and a variable beam expansion prism 8d. Thus, the combination of the first and second prisms 34,36 may be described by its combinative function as a dispersion element having an adjustable dispersion.

Figure 4:
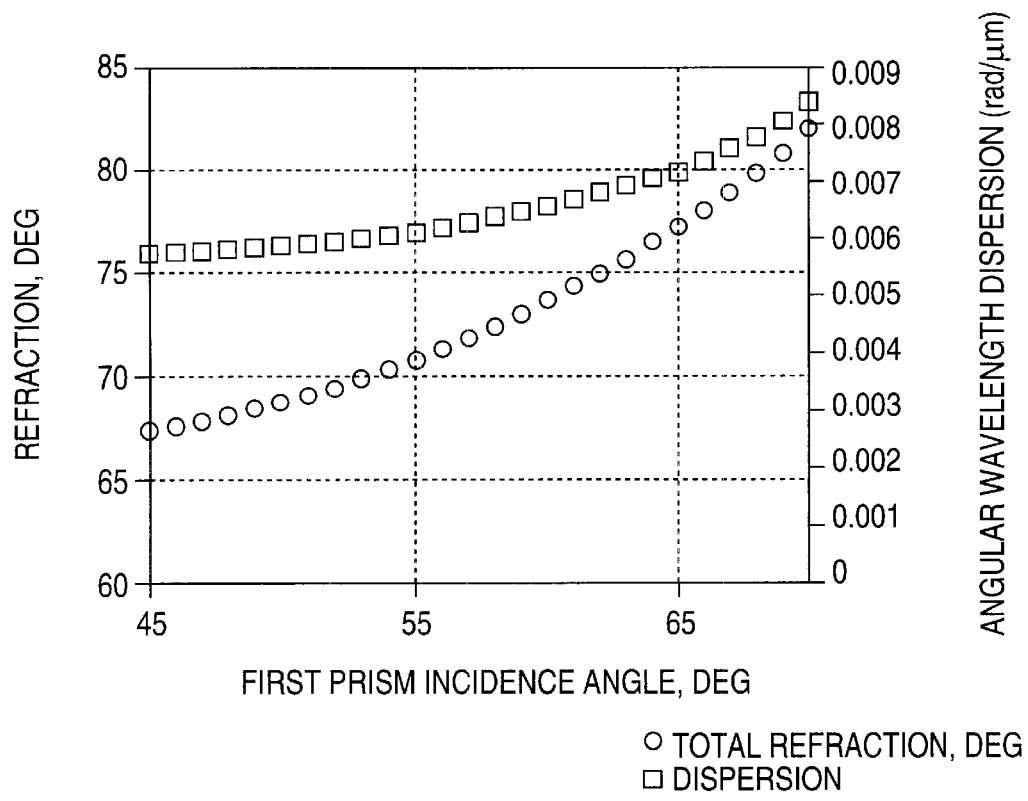
FIG. 4 shows the incidence angle dependence of the angular dispersion and refraction angle of the wavelength selection unit of the fourth embodiment of FIG. 2d.

FIG. 4 shows how the refraction angle and the total round trip angular dispersion $(d\alpha/d\lambda)_{(total)}$ vary as the prism pair 34,36 is rotated and the incidence angle is consequently varied from 45° and 70°. An inspection of the plot of FIG. 4 reveals that the total dispersion $(d\alpha/d\lambda)_{(total)}$ may be varied by a factor of 1.5, or as shown from around 0.0055 rad/nm to 0.0085 rad/nm when the incidence angle is varied from 45° to 70°. The refraction changes from around 67° to around 83° over the same range. The gear reduction ratio, or the ratio of the angular velocities of the first prism 34 and the second prism 36 was S=2.5. That is, the first prism 34 was rotated faster than the second prism 36 by a gear reduction ratio S=2.5. In addition to providing a smaller range of total dispersion $(d\alpha/d\lambda)_{(total)}$ values within which the system may be varied, the absolute angular dispersion is lower than that provided by the arrangement of FIG. 2a.

Figure 2E:
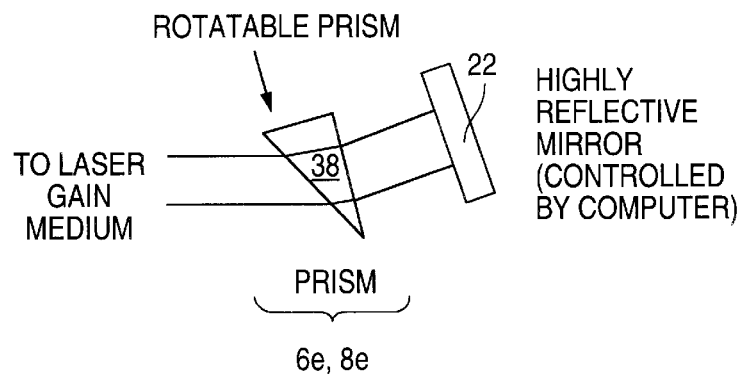
FIG. 2e shows a fifth embodiment of a wavelength selection unit according to the present invention.
Figure 5:
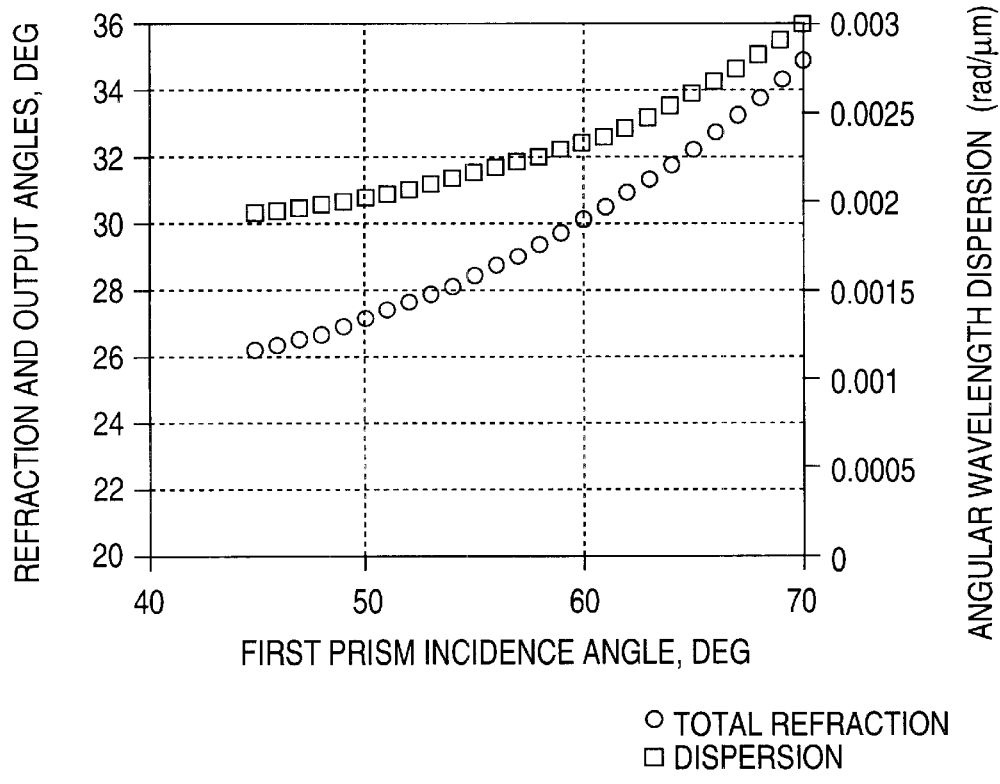
FIG. 5 shows the incidence angle dependence of the angular dispersion and refraction angle of the wavelength selection unit of the fifth embodiment of FIG. 2e.

FIG. 2e shows a further arrangement in accord with the present invention. The arrangement of FIG. 2e includes a highly reflective mirror 22 and a rotatable prism 38. The rotatable prism 38 by itself functions as both a dispersive element 6e and as a variable beam expander 8e. Thus, the prism 38 may be described as a dispersion element having an adjustable dispersion. The system exhibits a similar range of total dispersion variability as that of the arrangement of FIG. 2d. FIG. 5 reveals that the total dispersion may be varied by a factor of approximately 1.5, or as shown from around 0.0019 rad/nm to around 0.0030 rad/nm, when the incidence angle is varied from 45° to 70° due to rotation of the prism 38. The refraction angle varies from around 26° to around 35° over the same range. The arrangement of FIG. 2e provides yet a lower absolute angular dispersion than even the arrangement of FIG. 2d.

FIG. 5 shows how the refraction angle and the total dispersion vary as the prism 38 of the arrangement of FIG. 2e is rotated to vary the incidence angle between 45° and 70°. The apex angle of the prism 38 was taken to be 45° for generating the plot of FIG. 5.

A variable dispersion wavelength selector in accord with the present invention generally can be advantageously used for real-time automatic adjustment of the linewidth of a working laser. A typical layout of a line narrowed excimer laser having a wavelength control feedback loop is shown in FIG. 6. FIG. 6 shows an exemplary arrangement which illustrates how this automatic linewidth adjustment may be realized including a laser tube 40, a variable dispersion wavelength selector 42, an outcoupling mirror 44, a beam splitter 46, a wavelength monitor 48 and a processor 50.

A portion of the outcoupled beam is reflected by the beam splitter 46, and directed to the wavelength monitor 48. The processor 50 receives spectral information from the wavelength monitor 48 needed for determining what, if any, adjustments it should signal the wavelength selector 42 to make. The wavelength monitor 48 may comprise, for example, a temperature stabilized optical ètalon and a linear detector array. The wavelength monitor 48 provides a feedback signal to the processor 50 containing information on both the central wavelength and the linewidth of the laser output emission beam. After analyzing this information received from the wavelength monitor 48 the processor 50 may determine that the value of the output emission wavelength or the linewidth of the output emission beam should be adjusted. Advantageously, an arrangement, such as that of FIG. 6, in accord with the present invention, has the capability and flexibility of making such wavelength and linewidth adjustments. Moreover, it may do so automatically and on-line.

The processor 50 communicates both with the wavelength monitor 48 and the wavelength selector 42, preferably continuously while the laser system is on-line. The processor 50 may first receive wavelength and linewidth information from the wavelength monitor 48. The processor 50 may then send a signal to the wavelength selector 42 to cause the prism pair 26,28 of FIGS. 2a & 2b, e.g., to rotate to adjust the linewidth to a desired value different from its present value. In this way, the magnification, or expansion ratio, of the beam expansion unit of the wavelength selector 42 may be either reduced to broaden the linewidth, or increased to narrow the linewidth when the processor 50 signals the wavelength selector 42 which responds by rotating the prisms 26,28 in one direction or the other. The processor may simultaneously signal the actuator controlling the tilt of the highly reflective mirror 22 (or grating 30) to tilt the mirror 22 in order to adjust the wavelength to a desired value based on previous knowledge of a known wavelength shift caused by the rotation of the prisms 26,28.

Alternatively, the processor 50 may receive wavelength information from the wavelength monitor 48 after the prisms 26,28 are rotated to adjust the linewidth, and then based on this new wavelength information, the processor 50 may then send a signal to the actuator controlling the tilt of the mirror 22 or grating 30 to tilt the mirror 22 or grating 30 to adjust the wavelength of the output beam. The processor 50 may continuously, periodically or as desired monitor the linewidth and/or the wavelength and signal the wavelength selector 42 to vary the linewidth and/or wavelength on-line and automatically as discussed above.

The above described objects are met by the present invention. It is noted here that the present invention may be incorporated within many other types of tunable laser systems such as, e.g., dye lasers or solid-state lasers. It is also noted here that the configurations shown in FIGS. 2a–2e and 6 are exemplary and many other combinations of optical and electronic elements may be used that are within the scope of the present invention. For example, the dispersive element 6 or the beam expander 8, or both, of any of the above-described embodiments of the present invention may include one or more additional prisms. As a specific example, the preferred embodiment shown in FIG. 2a may be modified to include a fourth prism which is rotationally fixed, such that the embodiment would have two rotatable and two fixed prisms in all. In that regard, the scope of the present invention is meant to be that set forth in the claims that follow, and is not limited to any of the specific embodiments described above.

What is claimed is:

1. A laser system, comprising:
   a gain medium and a resonator for generating a laser beam;
   a wavelength selection unit for adjustably narrowing and tuning the beam;
   a beam linewidth and wavelength monitoring unit; and
   a processor configured to communicate with the beam monitoring unit and the wavelength selection unit,
   wherein values of the linewidth and the wavelength of the beam are monitored by the processor and adjusted to selected values,
   wherein the wavelength selection unit includes a first prism which is rotatably adjustable using the processor for controlling the linewidth of the beam,
   wherein the wavelength selection unit further includes one of a grating and a highly reflective mirror which is orientationally adjusted by the processor for controlling the wavelength the beam,
   wherein the wavelength selection unit further includes a second prism which is rotatably adjusted by the processor for compensating a refraction angle from the first prism when the first prism is rotated.

2. A laser system, comprising:
   a gain medium and a resonator for generating a laser beam;
   a wavelength selection unit for adjustably narrowing and tuning the beam;
   a beam linewidth and wavelength monitoring unit; and
   a processor configured to communicate with the beam monitoring unit and the wavelength selection unit,
   wherein values of the linewidth and the wavelength of the beam are monitored by the processor and adjusted to selected values,
   wherein the wavelength selection unit includes a first prism which is rotatably adjustable using the processor for controlling the linewidth of the beam,
   wherein the wavelength selection unit further includes a second prism which is rotatably controlled by the processor for compensating a refraction angle from the first prism when the first prism is rotated.

3. The laser system of claim 2, wherein the first and second prisms are synchronously rotatable.

4. The laser system of claim 3, wherein the first and second prisms are rotatable according to a preset relationship so that any changes in the refraction angle induced by rotation of the first prism are automatically compensated by rotation of the second prism.

5. The laser system of claim 4, wherein the angular rotation of the first and second prisms is performed according to a preset ratio.

6. The laser system of claim 4, wherein said first and second prisms are mounted onto rotational stages linked through one of a gear pair and a belt drive.

7. The laser system of claim 6, wherein the rotational stages rotate the first and second prisms at angular velocities related by a reduction ratio of said one of a gear pair and a belt drive.

8. A laser system, comprising:
   a gain medium and a resonator for generating a laser beam;
   a wavelength selection unit for adjustably narrowing and tuning the beam;

a beam linewidth and wavelength monitoring unit; and a processor configured to communicate with the beam monitoring unit and the wavelength selection unit, wherein values of the linewidth and the wavelength of the beam are monitored by the processor and adjusted to selected values, wherein the wavelength selection unit includes a first prism which is rotatably adjustable using the processor for controlling the linewidth of the beam, wherein the wavelength selection unit further includes a second prism which is synchronously rotatable with the first prism.

9. A laser system, comprising:

a gain medium and a resonator for generating a laser beam;

a wavelength selection unit for adjustably narrowing and tuning the beam;

a beam linewidth and wavelength monitoring unit; and a processor configured to communicate with the beam monitoring unit and the wavelength selection unit, wherein values of the linewidth and the wavelength of the beam are monitored by the processor and adjusted to selected values, wherein the wavelength selection unit includes a first prism which is rotatably adjustable using the processor for controlling the linewidth of the beam, wherein the wavelength selection unit further includes a second prism which is synchronously rotatable with the first prism, wherein said first and second prisms are mounted onto rotational stages linked through one of a gear pair and a belt drive.

10. The laser system of claim 2, wherein the second prism is simultaneously rotated with the first prism at a substantially constant ratio of the angular velocity of the first prism.

11. The laser system of claim 2, wherein the wavelength selection unit further includes a third prism for producing an angular dispersion of the beam.

12. The laser system of claim 11, wherein the wavelength selection unit further includes a fourth prism.

13. A tunable laser, comprising:

a gain medium, an electrical discharge circuit and a resonator for generating a laser beam;

an angular dispersion element; and a beam expander with adjustable magnification within said resonator;

a detector for monitoring a spectral parameter of the laser beam;

a processor for receiving a signal from the detector including information regarding the spectral parameter and for sending a signal to the beam expander for adjusting an orientation of the beam expander for adjustably magnifying the angular dispersion of said angular dispersion element such that the spectral parameter of the beam may be adjusted to a selected value.

14. The laser of claim 13, wherein the gain medium and resonator are those of one of an excimer laser and a $F_2$-laser.

15. The laser of claim 13, wherein said adjustable beam expander includes a first prism.

16. The laser of claim 15, wherein said first prism is rotatable.

17. The laser of claim 16, wherein said angular dispersion is adjusted when said first prism is rotated.

18. The laser of claim 17, wherein a processor controls an orientation of said prism.

19. The laser of claim 15, wherein said adjustable beam expander further includes a second prism.

20. The laser of claim 19, wherein said first prism and said second prism are rotatable.

21. The laser of claim 20, wherein said first prism and said second prism are synchronously rotatable.

22. The laser system of claim 21, wherein the first and second prisms are rotatable according to a preset relationship so that any changes in the refraction angle induced by rotation of the first prism are automatically compensated by rotation of the second prism.

23. The laser system of claim 22, wherein the angular rotation of the first and second prisms is performed according to a preset ratio.

24. The laser of claim 21, wherein said angular dispersion is adjusted when said first prism and said second prism are synchronously rotated.

25. The laser of claim 21, wherein said angular dispersion element comprises one of said first and second prisms.

26. The laser of claim 25, wherein said angular dispersion element further comprises a grating.

27. The laser of claim 21, wherein said angular dispersion element comprises a third prism.

28. The laser of claim 13, wherein said beam expander comprises only one rotatable prism.

29. The laser of claim 28, further comprising a processor, wherein an orientation of said only one prism is adjusted and controlled by a processor.

30. A tunable laser, comprising:

a gain medium and a resonator for generating a laser beam;

an angular dispersion element; and a beam expander with adjustable magnification within said resonator for adjustably magnifying the angular dispersion of said angular dispersion element such that the linewidth of the beam may be adjusted to a selected value, and further comprising a wavelength monitor and a processor which communicates with a wavelength selection unit and a wavelength monitor in a feedback loop.

31. A tunable laser, comprising:

a gain medium and a resonator for generating a laser beam;

an angular dispersion element; and a beam expander with adjustable magnification within said resonator for adjustably magnifying the angular dispersion of said angular dispersion element such that the linewidth of the beam may be adjusted to a selected value, and wherein said adjustable beam expander includes a first prism, and wherein said adjustable beam expander further includes a second prism, and wherein said first prism and said second prism are synchronously rotatable, and wherein said angular dispersion element comprises a third prism, and wherein the angular dispersion element further comprises a fourth prism.

32. A tunable laser including a gain medium and a resonator, comprising:

electrical means for generating a spectral emission of the gain medium;

dispersion means for angularly dispersing said spectral emission of the gain medium;

adjustable beam expander means for adjusting said angular dispersion;

detector means for monitoring a spectral parameter of the spectral emission; and processor means for receiving a signal from the detector means including information regarding the spectral parameter and for sending a signal to the adjustable beam expander means for adjusting an orientation of the adjustable beam expander to adjust the spectral parameter to a predetermined value.

33. The laser of claim 32, wherein the gain medium and resonator are those of one of an excimer laser and a $F_2$-laser.

34. The laser of claim 32, wherein said adjusting means includes a first rotatable prism.

35. The laser of claim 34, further comprising means for adjusting an orientation of said first rotatable prism.

36. The laser of claim 34, wherein said adjusting means further includes a second rotatable prism.

37. The laser of claim 36, wherein said first and second rotatable prisms are synchronously rotatable.

38. The laser system of claim 37, wherein the first and second prisms are rotatable according to a preset relationship so that any changes in the refraction angle induced by rotation of the first prism are automatically compensated by rotation of the second prism.

39. The laser system of claim 38, wherein the angular rotation of the first and second prisms is performed according to a preset ratio.

40. The laser system of claim 36, wherein the angular dispersion means includes a third prism.

41. The laser system of claim 40, wherein the angular dispersion means includes a fourth prism.

42. A method of adjusting an angular dispersion of a spectral emission of a laser having a gain medium and a resonator for generating a laser beam, and a beam expander having adjustable magnification and an angular dispersion element within the resonator, comprising the steps of:

operating the laser;

monitoring a spectral parameter of the laser beam at a spectrally-sensitive detector;

transmitting a signal from the detector to a processor including information regarding the spectral parameter;

transmitting a signal from the processor to the beam expander including instructions to adjust the magnification of the beam expander within the resonator to adjust the spectral parameter of the beam to a predetermined value.

43. The method of claim 42, further comprising the step of selecting one of an excimer laser and a $F_2$-laser for adjusting the angular dispersion of a spectral emission thereof.

44. The method of claim 42, further comprising the step of selecting a first rotatable prism for said adjustable beam expander, wherein the adjusting step includes the step of rotating the first prism.

45. The method of claim 44, further comprising the step of selecting a second rotatable prism for said adjustable beam expander, wherein the adjusting step further includes the step of rotating the second prism.

46. The method of claim 42, further comprising the step of selecting a first prism and a second prism that are synchronously rotatable prisms for said adjustable beam expander, wherein the adjusting step includes the step of synchronously rotating each of the first and second prisms.

47. The method of claim 46, wherein the adjusting step is performed such that any changes in the refraction angle induced by rotating the first prism are automatically compensated by rotating the second prism.

48. The method of claim 47, wherein the adjusting step includes the step of rotating the first and second prisms according to a preset ratio.

49. The method of claim 48, the resonator comprising a rotatably adjustable reflecting surface, wherein the adjusting step further comprises the step of rotating said reflecting surface to control the wavelength of the beam.

50. A method of adjusting an angular dispersion of a spectral emission of a laser having a gain medium and a resonator for generating a laser beam and an angular dispersion element, comprising the steps of:

providing a beam expander with adjustable magnification within the resonator; and adjusting the magnification of the beam expander within the resonator to set the linewidth of the beam to a predetermined value, and the method further comprising the step of selecting a first prism and a second prism that are synchronously rotatable prisms for said adjustable beam expander, and wherein the adjusting step includes the step of synchronously rotating each of the first and second prisms, and wherein the adjusting step is performed such that any changes in the refraction angle induced by rotating the first prism are automatically compensated by rotating the second prism, and wherein the adjusting step includes the step of rotating the first and second prisms according to a preset ratio, and the resonator comprising a rotatably adjustable reflecting surface, and wherein the adjusting step further comprises the step of rotating said reflecting surface to control the wavelength of the beam, and the method further comprising the step of providing a processor for communicating with and controlling the orientations of each of said first and second rotatable prisms and said rotatably adjustable reflecting surface.

51. The method of claim 46, further comprising the step of selecting a third prism for said angular dispersion element.

52. The method of claim 51, further comprising the step of selecting a fourth prism for said angular dispersion element.

53. A method of adjusting an angular dispersion of a spectral emission of a laser having a gain medium and a resonator for generating a laser beam and an angular dispersion element, comprising the steps of:

providing a beam expander with adjustable magnification within the resonator; and adjusting the magnification of the beam expander within the resonator to set the linewidth of the beam to a predetermined value, and further comprising the step of selecting a first rotatable prism to serve as both said adjustable beam expander and as said angular dispersion element, and wherein said dispersion element disperses the laser beam such that portions of the beam are dispersed outside of the acceptable angle of the resonator.

54. The method of claim 53, the selecting step includes selecting the first and a second rotatable prisms for said adjustable beam expander.

55. A tunable laser, comprising:

a gain medium, an electrical discharge circuit, and a resonator for generating a laser beam;

an angular dispersion element;

a processor; and a beam expander with adjustable magnification within said resonator for adjustably magnifying the angular dispersion of said angular dispersion element such that the linewidth of the beam may be adjusted to a selected value, and wherein the adjustable beam expander includes a first prism and a second prism that are synchronously rotatable, and wherein the processor is configured for communicating with and controlling the orientations of each of said first and second synchronously rotatable prisms.

56. The laser of claim 55, wherein the first and second prisms are rotatable according to a preset relationship so that any changes in the refraction angle induced by rotation of the first prism are automatically compensated by rotation of the second prism.

57. A tunable laser, comprising:

a gain medium, an electrical discharge circuit, and a resonator for generating a laser beam;

an angular dispersion element; and a beam expander with adjustable magnification within said resonator for adjustably magnifying the angular dispersion of said angular dispersion element such that the linewidth of the beam may be adjusted to a selected value, and wherein the adjustable beam expander includes a first prism and a second prism that axed synchronously rotatable, wherein the first ad second prism are rotatable according to a present relationship so that any changes in the refraction angle induced by rotation of the first prism are automatically compensated by rotation of the second prism, wherein the angular rotation of the first and second prisms is performed according to a preset ratio.

58. The laser of claim 57, wherein said angular dispersion is adjusted when said first prism and said second prism are synchronously rotated.

59. The laser of claim 57, wherein said angular dispersion element comprises one of said first and second prisms.

60. The laser of claim 57, wherein said angular dispersion element comprises a grating.

61. A tunable laser, comprising:

a gain medium, an electrical discharge circuit, and a resonator for generating a laser beam;

an angular dispersion element; and a beam expander with adjustable magnification within said resonator for adjustably magnifying the angular dispersion of said angular dispersion element such that the linewidth of the beam may be adjusted to a selected value, and wherein the adjustable beam expander includes a first prism and a second prism that are synchronously rotatable, wherein said angular dispersion element comprises a third prism.

62. A tunable laser, comprising:

a gain medium, an electrical discharge circuit, and a resonator for generating a laser beam;

an angular dispersion element;

a processor; and a beam expander with adjustable magnification within said resonator for adjustably magnifying the angular dispersion of said angular dispersion element such that the linewidth of the beam may be adjusted to a selected value, and wherein the adjustable beam expander includes a first prism and a second prism that are rotatable according to a preset relationship so that changes in the refraction angle induced by rotation of the first prism are compensated by rotation of the second prism, and wherein the processor is configured for communicating with and controlling the orientations of each of said first and second rotatable prisms.

63. The laser of claim 62, wherein the angular rotation of the first and second prisms is performed according to a preset ratio.

64. The laser of claim 62, wherein said angular dispersion is adjusted when said first prism and said second prism are rotated.

65. The laser of claim 62, wherein the angular dispersion element comprises a grating.

66. The laser of claim 62, wherein said angular dispersion element comprises a third prism.

* * * * *